US005963796A

United States Patent [19]

Kim

[11] Patent Number: 5,963,796

[45] Date of Patent: Oct. 5, 1999

[54] FABRICATION METHOD FOR SEMICONDUCTOR PACKAGE SUBSTRATE AND SEMICONDUCTOR PACKAGE

[75] Inventor: Sun Dong Kim, Choongcheongbuk-Do, Rep. of Korea

[73] Assignee: LG Semicon Co., Ltd., Cheongju, Rep. of Korea

[21] Appl. No.: 09/027,185

[22] Filed: Feb. 20, 1998

Related U.S. Application Data

[63] Continuation-in-part of application No. 08/687,929, Jul. 29, 1996, and application No. 08/749,963, Nov. 18, 1996, Pat. No. 5,877,561.

[30] Foreign Application Priority Data

Mar. 27, 1997 [KR] Rep. of Korea ...................... 97-10773

[51] Int. Cl.[6] .......................... H01L 21/44; H01L 21/48; H01L 21/50

[52] U.S. Cl. .......................... 438/125; 438/106; 438/123

[58] Field of Search .................................... 438/125, 123, 438/106

[56] References Cited

U.S. PATENT DOCUMENTS 3,290,564 12/1966 Wolff ....................................... 317/234
3,947,867 3/1976 Duffek et al. ............................ 357/70
4,396,936 8/1983 McIver et al. ............................ 357/81
4,420,767 12/1983 Hodge et al. ............................ 357/81
4,975,761 12/1990 Chu ........................................... 357/72
5,012,386 4/1991 McShane et al. ....................... 361/386
5,339,518 8/1994 Tran et al. ............................. 438/123
5,455,384 10/1995 Ichihara ................................ 174/52.2
5,471,011 11/1995 Maslakow ............................. 174/52.4
5,490,324 2/1996 Newman ................................... 29/830
5,523,622 6/1996 Harada et al. ......................... 257/734
5,536,362 7/1996 Love et al. ............................. 438/125
5,574,309 11/1996 Papapietro et al. ..................... 257/679
5,600,101 2/1997 Sakai ...................................... 174/261
5,604,328 2/1997 Kubota et al. ........................ 174/52.1
5,608,265 3/1997 Kitano et al. .......................... 257/738
5,756,377 5/1998 Ohsawa .................................. 438/123

FOREIGN PATENT DOCUMENTS

95/22839 7/1995 Rep. of Korea .

*Primary Examiner*—Kevin M. Picardat
*Assistant Examiner*—D. Mark Collins
*Attorney, Agent, or Firm*—Fleshner & Kim

[57] ABSTRACT

A fabrication method for a chip package includes the steps of forming a first substrate having embedded leads, forming a second substrate with embedded leads and a central aperture therethrough, and attaching the second substrate to the first substrate to form a substrate with a recess for receiving a chip. A chip may then be mounted within the central aperture of the second substrate, on the first substrate, and bond pads of the chip may be attached to leads exposed on one of the first and second substrates with a plurality of metal wires. A resin may be molded over the device to protect the metal wires, the chip, and the leads.

18 Claims, 8 Drawing Sheets

FABRICATION METHOD FOR SEMICONDUCTOR PACKAGE SUBSTRATE AND SEMICONDUCTOR PACKAGE

This application is a continuation-in-part of application Ser. No. 08/687,929, which was filed Jul. 29, 1996 and application Ser. No. 08/749,963, filed Nov. 18, 1996, now U.S. Pat. No. 5,877,561.

BACKGROUND OF THE INVENTION

1. Field of the Invention

The present invention relates to a fabrication method for a semiconductor package substrate and a semiconductor package, and more particularly, to a fabrication method for a column lead package (CLP).

2. Background of the Related Art

FIG. 1 shows a cross-sectional view of a Quad Flat Package, in which a semiconductor chip 3 is mounted on a paddle 2 of a lead frame 1. The chip 3 is electrically connected to inner leads 1*a* of the lead frame 1 by bonding wires 4, and the entire whole body 5 except for outer leads 1*b* is encapsulated by an epoxy molding compound.

The Quad Flat Package is disadvantageous since precise alignment of the outer leads 1*b* onto the bonding pads of a printed circuit board (PCB) is difficult. Further, the outer leads 16 may be damaged or deformed due to external impacts during the lead-forming process in which the outer leads 16 are bent into prescribed shapes. The repairing of the chip package defects when mounted on a PCB has been troublesome, and simplification of the fabrication process has been difficult.

SUMMARY OF THE INVENTION

In one embodiment of the present invention, a semiconductor package includes: a plate within which a plurality of leads and a heat sink are embedded; a semiconductor chip attached to the heat sink of the plate; a plurality of metal wires for electrically connecting a plurality of the leads of the plate and the semiconductor chip; and an epoxy molding compound for encapsulating a predetermined portion of the plate.

In alternate embodiments, a recess may be formed in an upper surface plate, and the chip may be mounted in the recess. In this embodiment, a cover member may be attached to upper portions of the plate to encapsulate the chip. The cover may have embedded metallic leads that are in registration with the metallic leads of the plate.

In other embodiments of the invention, a second substrate having a hole at its central portion is stacked on a first substrate to form a combined substrate having a recess, instead of forming a cavity by grinding the central portion of a single semiconductor package substrate.

In each of the embodiments, the leads may be embedded in the substrate such that portions of the leads are exposed along side edges to the substrate. Bond pads of the semiconductor chip may be connected to the leads with metal wires. An insulating material can then be used to package the chip, the metal wires and portions of the leads and the substrate.

A component of a chip package embodying the invention can include a plate having first and second opposing surfaces, a heat conducting member formed in the plate and configured to receive a chip, wherein a lower surface of the heat conducting member is substantially flush with the second surface of the plate, and a plurality of electrically conductive members formed in the plate and configured to be electrically coupled to bond pads of a chip mounted on the plate, wherein the electrically conductive members extend substantially from the first surface to the second surface of the plate.

A chip package embodying the invention can include a plate having first and second surfaces, the plate having a heat conducting member embedded in the plate, a plurality of electrically conductive members embedded in the plate such that the electrically conductive members extend between the first and second surfaces of the plate; a chip mounted on the heat conducting member; a plurality of conductive media connecting bond pads of the chip to corresponding ones of the electrically conductive members; and an insulative material that packages the chip, the plurality of conductive media and a portion of the plate.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

A method of making a device embodying the invention will now be described with reference to FIGS. 2A–2G.

Figure 2A:
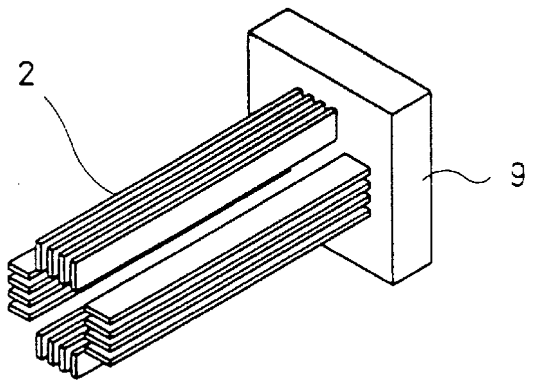
FIGS. 2A through 2G are views showing a fabrication method for one of the preferred embodiments of a CLP according to the invention.
Figure 2B:
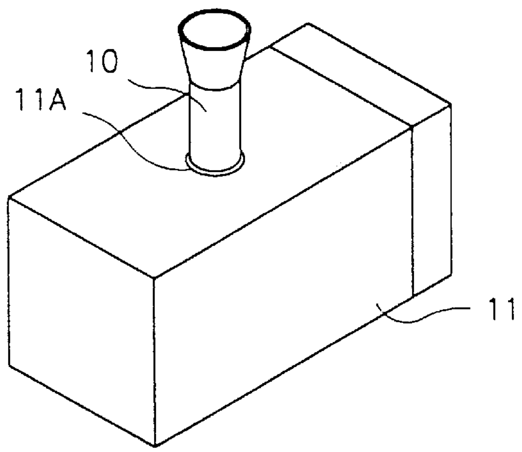
Figure 2C:
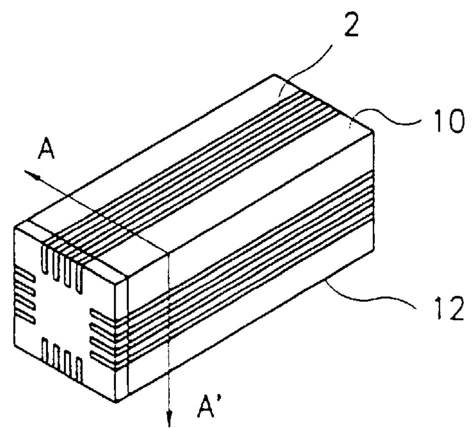

First, as shown in FIG. 2A, a plurality of column lead frames 2, formed of a conductive material, are supported in a plurality of recesses in an upper surface of a column lead frame support 9. The entire body shown in FIG. 2A is then inserted into a mold 11, as shown in FIG. 2B. Next, a liquid insulating resin 10 fills the mold 11 through a hole 11A formed in the mold 11. When the liquid insulating resin 10 hardens, the mold 11 is removed and a unit column frame 12, as shown in FIG. 2C, is obtained.

When the unit column frame 12 is sliced along the line A-A', a flat first substrate 1 having leads 2 embedded within hardened insulating resin 10 is obtained, as shown in FIG.

2D. As shown in FIG. 2E, a cavity 3*a* is formed in a central portion of the first substrate 1 for receiving a chip 3. The cavity is formed by a grinding or polishing process.

A bonding material (not shown) is then applied to a surface of the cavity 3*a* . A die bonding process is carried out to attach a chip 3 in the cavity 3*a*. Next, a wire bonding process is performed to electrically couple bond pads on the semiconductor chip 3 to the leads 2 of the substrate 1 via a plurality of wires 4. As shown in FIG. 2G, an epoxy molding compound 5 is then applied over the semiconductor chip 3 to complete fabrication of the semiconductor package. Such a package is disclosed in application Ser. No. 08/687,929 which is incorporated herein by reference.

An alternate embodiment of the invention will now be described with reference to FIGS. 3A–3I. In this embodiment, it is not necessary to form a recess in a top surface of the substrate by a grinding or a polishing operation.

Figure 2D:
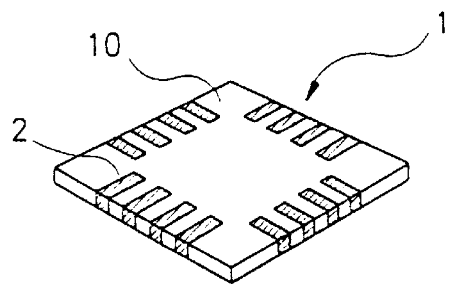
Figure 2E:
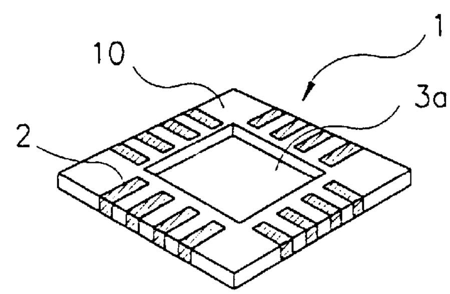
Figure 2F:
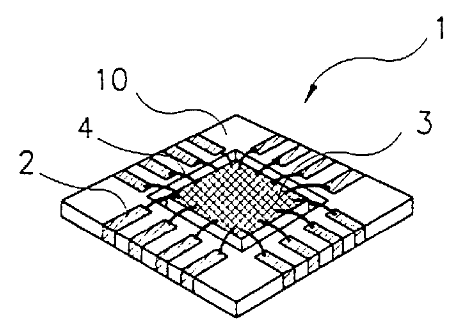
Figure 2G:
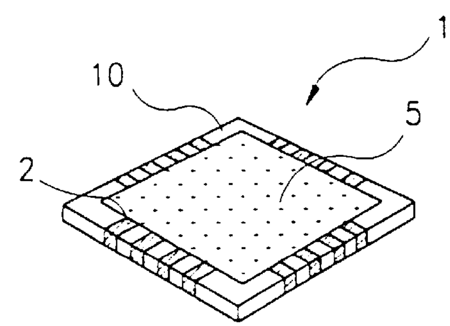

First, a first substrate 1 is formed as shown in FIG. 2D, according to the method shown in FIGS. 2A through 2C. In an alternative embodiment, the first substrate may have a heat dissipating portion disposed in a central portion thereof, as disclosed in application Ser. No. 08/749,963, which is incorporated herein by reference. In such an embodiment, a conductive column is inserted into the central portion of the leads 2 of FIG. 2A prior to the step illustrated in FIG. 2B. A semiconductor chip mounted on the heat dissipating portion will be able to more easily conduct heat outside the package. Next, a second substrate is formed as will be described below with reference to FIGS. 3A–3E.

Figure 3A:
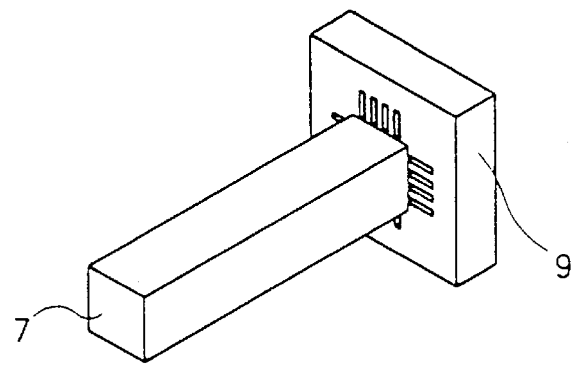
FIGS. 3A through 3I are views showing another fabrication method for another embodiment of a CLP according to the invention.
Figure 3B:
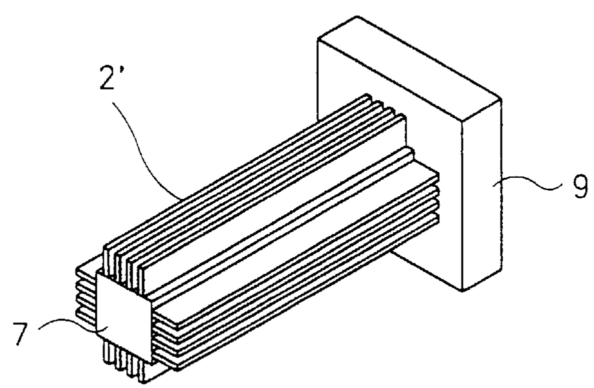
Figure 3C:
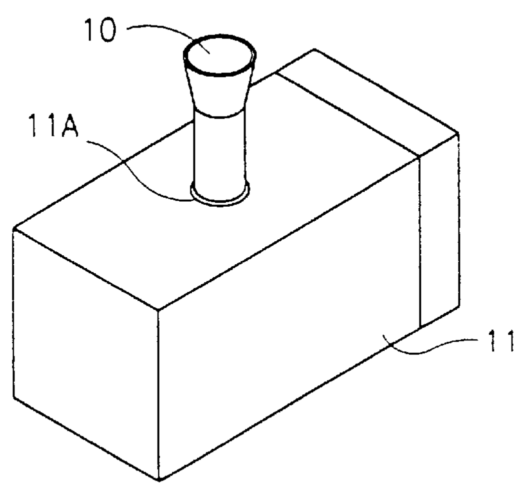
Figure 3D:
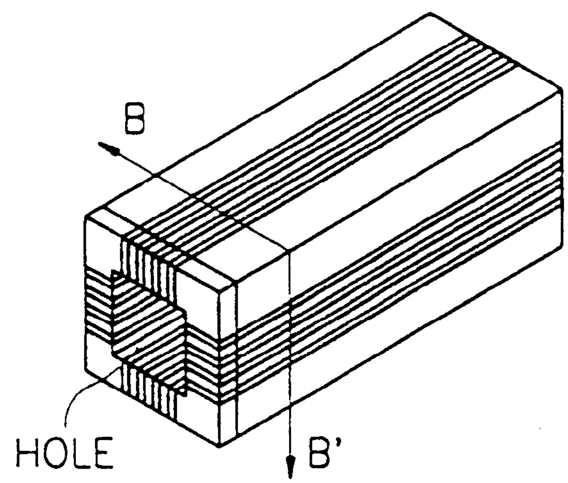
Figure 3E:
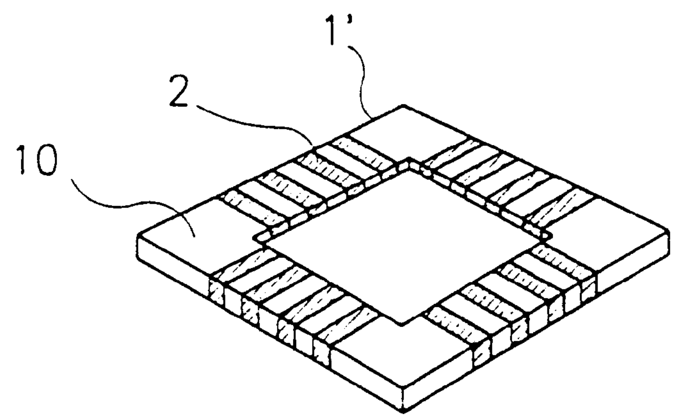

As shown in FIG. 3A, an internal mold 7 is supported on a column lead frame support 9. Next, as shown in FIG. 3B, a conductive material 2', which will serve as the column lead frame is supported around the internal mold 7. Then, as shown in FIG. 3C, the entire body of FIG. 3B is put in the external mold 11 and a liquid insulating resin 10 is poured through a hole 11A formed on the external mold 11. The liquid insulting resin 10 is hardened, and the internal mold 7 and the external mold 11 are removed, resulting in the fabrication of a unit column frame having an empty or open central portion, as shown in FIG. 3D. The unit column frame is sliced along the line B-B', resulting in a second substrate 1', as shown in FIG. 3E. The second substrate 1' also has leads with an upper, lower and side surface exposed. The second substrate 1' also has a central aperture extending therethrough.

Figure 3F:
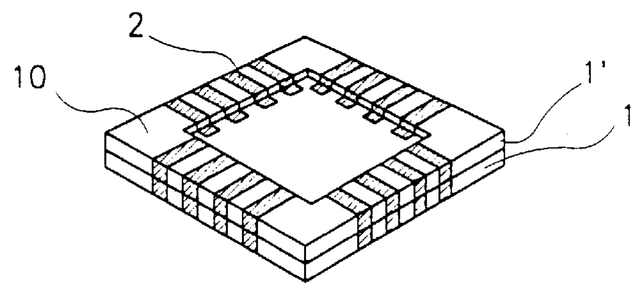
Figure 3G:
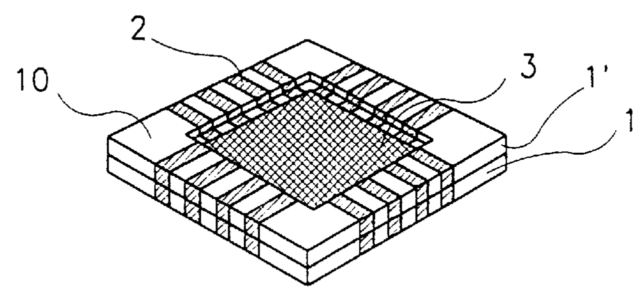
Figure 3H:
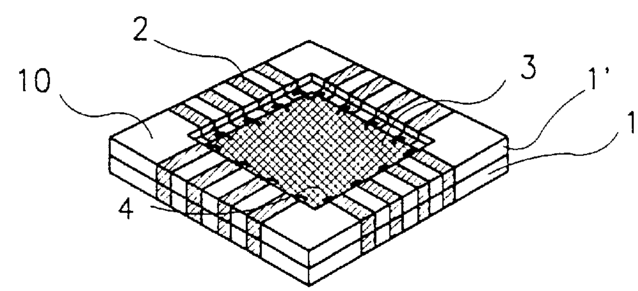

Then, as shown in FIG. 3F, the second substrate 1' is placed on and attached to the first substrate 1. The attachment may be carried out by applying a solder on the attaching surface of the leads of the first and second substrates 1,1' or by using a tape made of insulating material and conductive material. If the leads 2 are formed of lead, the lead may be melted by heating the semiconductor package substrates 1,1', resulting in the fabrication of the semiconductor package substrate as shown in FIG. 3F. As shown in FIG. 3G, a semiconductor chip 3 is then attached in the recess at the central portion formed by the first and second substrates 1,1'. As shown in FIG. 3H, a wire bonding process is then carried out to attach bond pads on the semiconductor chip 3 to corresponding leads via a plurality of wires 4.

Figure 3I:
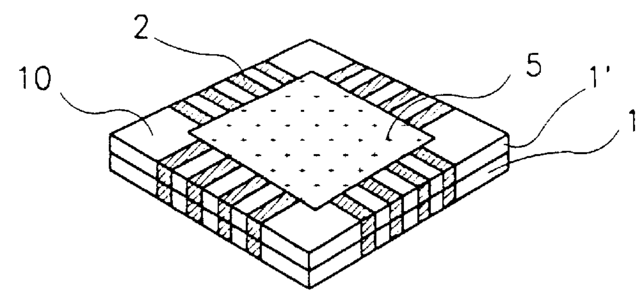

In alternate embodiments, the chip may be attached to the leads of the second substrate 1' via a plurality of wires 4. In still other embodiments, bond pads of the semiconductor chip 3 may be mounted on and attached to the leads of the first substrate 1 via a plurality of solder balls. After the semiconductor chip 3 is connected to the leads, a molding process is performed, as shown in FIG. 3I, resulting in a completed semiconductor package. In an alternate embodiment, an upper surface of the semiconductor chip 3 could be left exposed outside the molding compound to better conduct heat outside the package.

A fabrication method for a semiconductor package according to the above described embodiments can prevent a semiconductor package substrate from being broken by a grinding or a polishing operation. Also, the above-described process eliminates the need to carry out the difficult and time consuming grinding process needed to form a rectangular cavity in a center of the substrate for receiving a chip. This reduces costs and enhances productivity.

As mentioned above, in still other embodiments of the invention, the chip package has a heat sink which is capable of more easily conducting heat generated in the interior of a semiconductor package outside the package. This semiconductor package is also created by fabricating a semiconductor package using a unit column frame, within which a plurality of leads and a heat sink are embedded. The plate type package body is sliced from the unit column frame at regular intervals.

Figure 4A:
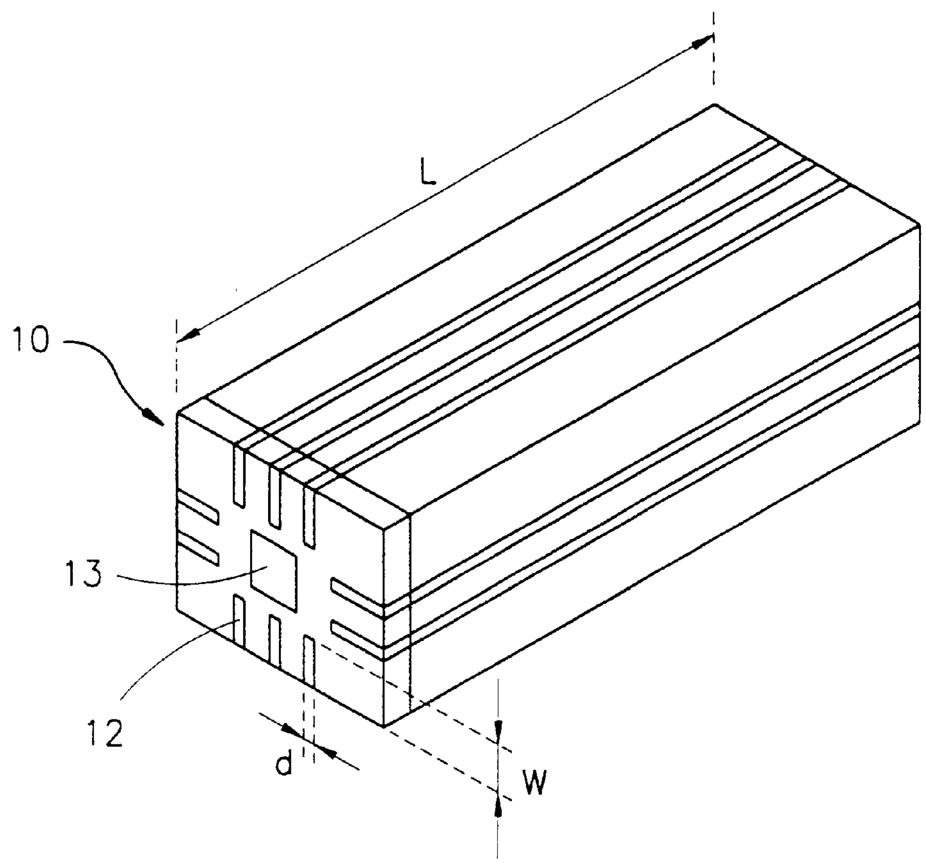
FIG. 4 is a perspective view of a column of material for forming individual plates and FIG. 4A shows a plate that has been separated from the column.
Figure 4B:
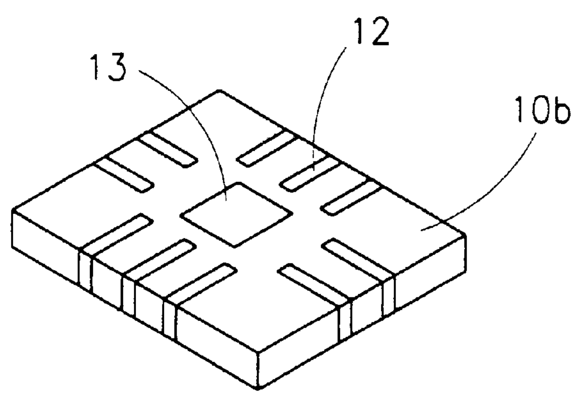

FIGS. 4A and 4B show a unit column frame and a sliced plate in accordance with this embodiment of the present invention. As shown therein, the unit column frame 10 includes a column-shaped body having a predetermined length (l), a column-shaped heat sink 13 embedded within the center portion of the body, and a plurality of leads 12 which are arranged at a periphery of the heat sink 13. The heat sink 13 is exposed to the upper and lower surfaces of the body, and predetermined portions of the leads 12 are exposed on side surfaces of the body by a predetermined thickness (d). In the drawing, the one-dot-one-dash lines denote a cut-away portion of the body.

The column-type body is generally made of an insulation material. The column-type body is made in a square shape or other appropriate shape, e.g., circular. Other shapes can be adapted to the present invention. The unit column frame is sliced at a desired interval (thickness) for example by 1 mm, 1.5 mm, or 2.0 mm. The sliced unit column frame becomes a plate, as shown in FIG. 4B, which is used for fabricating a semiconductor package.

Figure 5:
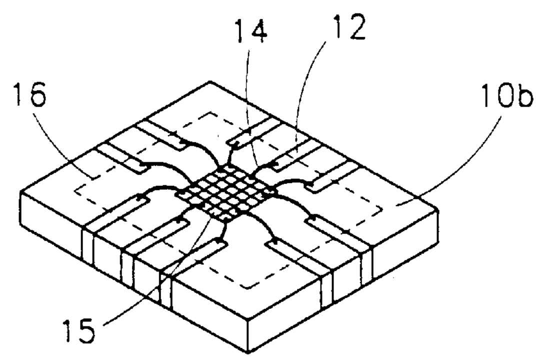
FIG. 5 is a perspective view of a plate type semiconductor package having a heat sink according to an embodiment of the present invention.

FIG. 5 shows a plate-shaped semiconductor package having a heat sink according to this embodiment of the present invention. As shown therein, a semiconductor chip 15 is mounted on the heat sink 13, and bond pads of the semiconductor chip 15 and a plurality of leads 12 are electrically bonded to each other using metal wires 14. The reference numeral 16 denotes a molding line. The upper portion of the plate 10*b* is sealingly encapsulated and hardened using an epoxy molding compound (not shown).

Figure 6:
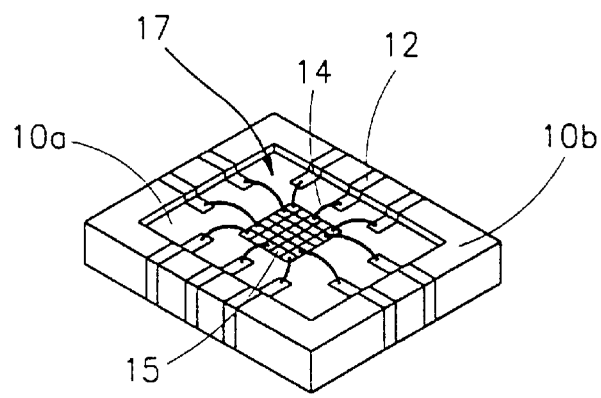
FIG. 6 is a perspective view of a plate type semiconductor package having a heat sink according to an embodiment of the present invention.

FIG. 6 shows a plate-shaped semiconductor package having a heat sink according to another embodiment of the present invention. As shown therein, a recess 10*a* is formed by grinding or polishing a portion of the upper surface of the plate 10*b*, which is sliced from the unit column frame 10. Thereafter, a semiconductor mounting process, and a wire bonding process, which are described in the previous embodiment, are conducted. The recess 10*a* is encapsulated using an epoxy molding compound 17, thus forming a semiconductor package, whereby it is possible to fabricate a thinner semiconductor package as compared to the previous embodiment of the present invention.

Figure 7:
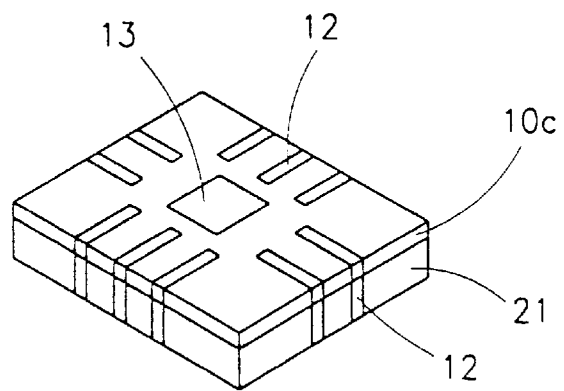
FIG. 7 is a perspective view of a plate type semiconductor package having a heat sink according to another embodiment of the present invention.

FIG. 7 shows a plate-shaped semiconductor package having a heat sink according to yet another embodiment of the present invention. In this embodiment, a cover 21*b* is used to encapsulate the chip instead of the epoxy molding compound of the previous embodiment. The cover 21 may be obtained by slicing the unit column frame 10. The plate 10*a* and the cover 21 may have different thicknesses.

Figure 1:
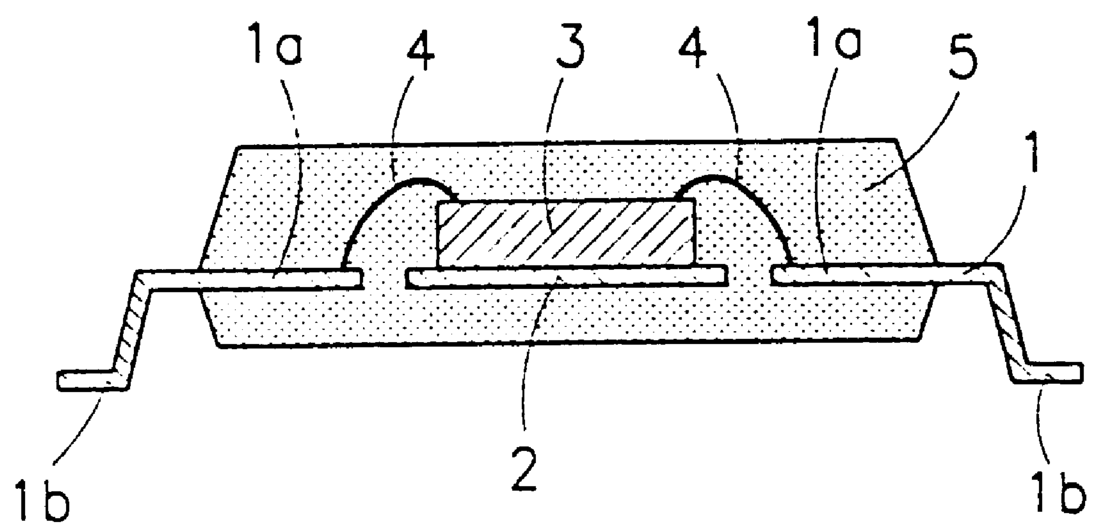
FIG. 1 is a plan view showing a conventional QFP.

A plate having a heat sink and a column type semiconductor package of the present invention prevents a bending of leads that may occur with the prior art device shown in FIG. 1. In addition, it is possible to more easily mount the chip on the substrate since a plurality of leads and the upper and lower surfaces of the plate- or column-shaped semiconductor package are exposed. In addition, lamination type structure is possible, so that the maintenance is easy.

Since the heat sink is exposed to the upper and lower surfaces of the plate- or column-shaped semiconductor package are exposed, heat from the interior of the package can be more effectively conducted outside the package, thus reducing malfunctions of the chip. The cost of the fabrication process can be reduced, and productivity is increased, as compared to the conventional semiconductor package fabrication process.

Although the preferred embodiments of the present invention have been disclosed for illustrative purposes, those skilled in the art will appreciate that various modifications, additions and substitutions are possible, without departing from the scope and spirit of the invention as described in the accompanying claims.

The foregoing embodiment is merely exemplary and not to be construed as limiting the present invention. The present invention can be readily applied to other type of semiconductor packages. One of ordinary skill in the art can use the teachings of the present invention to other devices requiring easier and smaller fabrication of semiconductor packages. The description of the present invention is intended to be illustrative, and not limiting the scope of the claims. Many alternatives, modifications and variations will be apparent to those skilled in the art.

What is claimed is:

1. A method for making a component of a chip package, comprising the steps of:

forming a first substrate having a plurality of embedded leads such that upper, lower and outer side surfaces of the leads are exposed;

forming a second substrate having plurality of embedded leads and a hole in an interior portion thereof; and attaching the second substrate to the first substrate.

2. The method of claim 1, wherein the step of forming a second substrate comprises:

supporting an internal mold on a column lead frame support;

supporting a column lead frame around the internal mold;

putting the column lead frame support, the internal mold and the column lead frame inside an external mold;

filling the external mold with an insulating resin;

hardening the insulating resin to form a body having the column lead frame embedded therein;

removing the external mold;

removing the internal mold; and cutting a wafer from the body to obtain the second substrate.

3. The method of claim 1, wherein the step of attaching the second substrate on the first substrate comprises heating and cooling the substrates so that the leads of the first and second substrates become attached to one another.

4. The method of claim 3, wherein the steps of forming first and second substrates comprises forming the first and second substrates with leads made of lead.

5. The method of claim 1, wherein the step of attaching the second substrate to the first substrate comprises attaching the second substrate to the first substrate with a tape having insulating and conducting portions.

6. The method of claim 1, wherein the step of attaching the second substrate to the first substrate comprises applying a solder to exposed portions of the leads.

7. The method of claim 1, further comprising the steps of:

attaching a chip to the first substrate such that the chip is inside the hole in the second substrate;

connecting bond pads of the chip to the leads of at least one of the first and second substrates via a plurality of conductive media; and forming a molding unit for protecting the conductive media and the leads of the first substrate.

8. A method of forming a chip package, comprising the steps of:

forming a first substrate having a plurality of embedded first leads;

forming a second substrate having an aperture therethrough and having a plurality of second leads;

attaching the second substrate to the first substrate; and mounting a chip on the first substrate such that it is within the aperture of the second substrate.

9. The method of claim 8, wherein the step of forming a second substrate comprises forming the second substrate such that said plurality of second leads are embedded therein.

10. The method of claim 9, further comprising the step of coupling bond pads on the chip to corresponding leads of the second substrate.

11. The method of claim 9, wherein the step of attaching the second substrate to the first substrate comprises coupling the first leads of the first substrate with corresponding second leads of the second substrate.

12. The method of claim 8, wherein the step of forming a first substrate comprises forming a heat sink at a central portion of the first substrate.

13. The method of claim 12, further comprising the step of coupling the leads of the first substrate to bond pads of the chip.

14. The method of claim 13, wherein the coupling step comprises coupling the leads of the first substrate to bond pads of the chip with a plurality of wires.

15. The method of claim 13, wherein the coupling step comprises coupling the leads of the first substrate to bond pads of the chip with a plurality of solder bumps.

16. The method of claim 12, wherein the step of attaching the second substrate to the first substrate comprises coupling the leads of the first substrate with corresponding leads of the second substrate.

17. The method of claim 8, further comprising the step of applying a molding compound inside the aperture of the second substrate to at least partially cover the chip.

18. The method of claim 8, wherein the step of forming a first substrate comprises forming the first substrate so that a heat conducting portion is embedded therein, and wherein the mounting step comprises mounting the chip on the heat conducting portion of the first substrate.

* * * * *